(12) United States Patent
Hirose

(10) Patent No.: US 7,268,420 B2
(45) Date of Patent: Sep. 11, 2007

(54) SEMICONDUCTOR DEVICE HAVING LAYERED CHIPS

(75) Inventor: Yukitoshi Hirose, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 95 days.

(21) Appl. No.: 11/019,618

(22) Filed: Dec. 23, 2004

(65) Prior Publication Data

US 2005/0139978 A1 Jun. 30, 2005

(30) Foreign Application Priority Data

Dec. 26, 2003 (JP) ............... 2003-431961

(51) Int. Cl.
*H00L 23/02* (2006.01)
*H00L 23/04* (2006.01)
*H00L 23/52* (2006.01)

(52) U.S. Cl. .............. 257/686; 257/698; 257/774; 257/777

(58) Field of Classification Search ........ 257/686, 257/698, 773, 774, 777
See application file for complete search history.

(56) References Cited

U.S. PATENT DOCUMENTS 5,619,465 A * 4/1997 Nomura et al. ........... 365/206
6,037,677 A * 3/2000 Gottschall et al. ........ 307/43
6,242,814 B1 6/2001 Bassett
6,421,281 B2 * 7/2002 Suzuki ................. 365/189.09

FOREIGN PATENT DOCUMENTS

| DE | 102 61 009 | 7/2003 |
|----|---|---|
| EP | 0 617 466 | 9/1994 |
| JP | 5-41463 | 2/1993 |
| JP | 10-163411 | 6/1998 |
| JP | 2002-305283 | 10/2002 |
| JP | 2003-60053 | 2/2003 |

* cited by examiner

*Primary Examiner*—Howard Weiss
*Assistant Examiner*—Shrinivas H. Rao
(74) *Attorney, Agent, or Firm*—Young & Thompson

(57) ABSTRACT

A semiconductor device includes an interface chip and a plurality of DRAM chips consecutively layered on the interface chip. A plurality of source electrodes, a plurality of ground electrodes, and a plurality of signal electrodes penetrate DRAM chips and interconnect the DRAM chips to the interface chip, which is connected to an external circuit. Each source electrode, a corresponding signal electrode and a corresponding ground electrode are arranged adjacent to one another in this order to reduce electromagnetic noise during operation of the DRAM chip.

6 Claims, 8 Drawing Sheets

SEMICONDUCTOR DEVICE HAVING LAYERED CHIPS

BACKGROUND OF THE INVENTION (a) Field of the Invention

The present invention relates to a semiconductor device having layered chips and, more particularly, to a semiconductor device having a plurality of semiconductor chips layered one on another.

(b) Description of the Related Art

Recent developments of digital-data electronic appliances in terms of smaller dimensions as well as higher performances require semiconductor packages to have smaller dimensions as well as a higher density. In the semiconductor packaging technology, a semiconductor device having a plurality of layered semiconductor chips now attracts larger attentions in view of the possibility of a higher density. This technology is generally used in digital-data electronic appliances, such as portable phone, digital camera and personal data assistant, which are required to have smaller weights as well as smaller dimensions and higher performances.

FIG. 8A shows a conventional semiconductor device having a multi-layered semiconductor chips in a top plan view thereof, whereas FIG. 8B shows the same semiconductor device in a sectional view taken along A-A in FIG. 8A. The semiconductor device 200 includes a base substrate 201, and a bottom semiconductor chip $202_1$ having a largest size, another semiconductor chip $202_2$ having a medium size, and a top semiconductor chip $202_3$ having a smallest size, which are layered on the base substrate 201 in this order.

Each semiconductor chip 202 has a peripheral area on which electrode pads 203 are disposed. The base substrate 201 and the semiconductor chips 202 are interconnected between electrode pads 203 thereof by using bonding wires 204. In the configuration of the semiconductor device 200, an underlying semiconductor chip 202 must have smaller dimensions compared to the overlying semiconductor chip 202.

In the semiconductor device 200 shown in FIGS. 8A and 8B, the electrode pads 203 should have a width of around 100 μm or above in order for achieving reliable connections between the bonding wires 204 and the electrode pads 203. In addition, the pitch of the electrode pads 203 should not be extremely small, and thus, the number of electrode pads 203 disposed in the semiconductor chip 202 is limited.

If, for example, the semiconductor chip 202 is implemented as a DRAM (dynamic random access memory) chip, the electrode pads 203 should be disposed for, in addition to the power source terminal (source terminal) and the ground terminal, a large number of signal terminals such as address signal, command signal, and data signal terminals. Thus, the number of electrode pads 203 assigned to the source terminal and ground terminal is limited.

A semiconductor device having multi-layered semiconductor chips having equivalent dimensions among them is described in Patent Publication JP-A-10-163411, for example. FIG. 9 shows the described semiconductor chip in a sectional view thereof. In this technique, after a plurality of semiconductor chips 301 having the same dimensions are layered one on another, a plurality of plugs (electrodes) 303 made of conductive resin are formed which penetrate the layered semiconductor chips 301 at the positions where electrode pads 302 are located. This technique allows reduction in the dimensions of the semiconductor chips because the bonding pads for the bonding wires need not be provided.

In the structure of the semiconductor device 300 shown in FIG. 9, although the number of electrode pads can be increased compared to the semiconductor device 200 shown in FIGS. 8A and 8B, the semiconductor device 300 may involve problems as detailed below, if the source electrodes and ground electrodes are disposed apart from the signal electrodes.

FIG. 10 shows, in a perspective view, a conceivable structure for a DRAM device implementing the semiconductor device 300 shown in FIG. 9, wherein a signal electrode is disposed apart from the source electrode and the ground electrode. Specifically, the semiconductor device 400 includes an IF (interface) chip 401 and four DRAM chips 402 ($402_0$ to $402_3$) consecutively layered on the IF chip 401. The electric power supplied from an external power source to the IF chip 401 is supplied through an inter-chip power source electrode (source electrode) 403 and an inter-chip ground electrode 404 to an intra-chip source line 405 and an intra-chip ground line 406, respectively, of each of the DRAM chips 402. Each DRAM chip 402 has a plurality of drivers 407 in the peripheral area thereof, which operate on the electric power supplied through the intra-chip source line 405 and intra-chip ground line 406. The output signal of each driver 407 is fed through the inter-chip signal electrode 408 and the IF chip 401 toward an external circuit.

It is assumed here that a driver 407 disposed in the top DRAM chip $402_3$ now delivers an output signal that rises from a low level to a high level. A charge current flows in the direction of arrow 409 to charge an inter-chip signal electrode 408 connected to the output of the driver 407. More specifically, the charge current flows from the external high-potential power source line, through the IF chip 401, inter-chip source electrode 403, intra-chip source line 405, inter-chip signal electrode 408 and the IF chip 401 to return to the external low-potential power source line (ground line), whereby the charge current flows through a three-dimensional current path.

When the output of the driver 407 in the top DRAM chip $402_3$ changes from a low level to a high level, as described above, electromagnetic noise is generated outside the semiconductor device 400, depending on the loop area, magnitude and frequency components of the charge current. This type of semiconductor device 400 emits a relatively higher level of the electromagnetic noise due to the structure of the inter-chip electrodes. In addition, cross-talk is also generated between two signal inter-chip signal electrodes 408 extending parallel and adjacent to one another.

SUMMARY OF THE INVENTION

In view of the above, it is an object of the present invention to provide a semiconductor device having a plurality of layered semiconductor chips, which is capable of reducing electromagnetic noise emitted from the inter-chip signal electrodes.

It is another object of the present invention to provide a semiconductor device having a plurality of layered semiconductor chips, which is capable of suppressing cross-talk between adjacent inter-chip signal electrodes.

The present invention provides a semiconductor device including a plurality of semiconductor chips layered one on another, and a plurality of inter-chip electrodes each penetrating at least one of the semiconductor chips and interconnecting at least two of the semiconductor chips, the inter-chip electrodes including at least one inter-chip first power source electrode, at least one inter-chip second power source electrode and at least one inter-chip signal electrode, wherein the inter-chip signal electrode is disposed adjacent to both of the inter-chip first power source electrode and the inter-chip second power source electrode.

In accordance with the semiconductor device of the present invention, the loop current flowing through the inter-chip electrodes has a reduced loop area because the inter-chip signal electrode is disposed adjacent to the inter-chip first and second power source electrodes, whereby the electromagnetic noise generated by the loop current is reduced.

The above and other objects, features and advantages of the present invention will be more apparent from the following description, referring to the accompanying drawings.

PREFERRED EMBODIMENTS OF THE INVENTION

Figure 1:
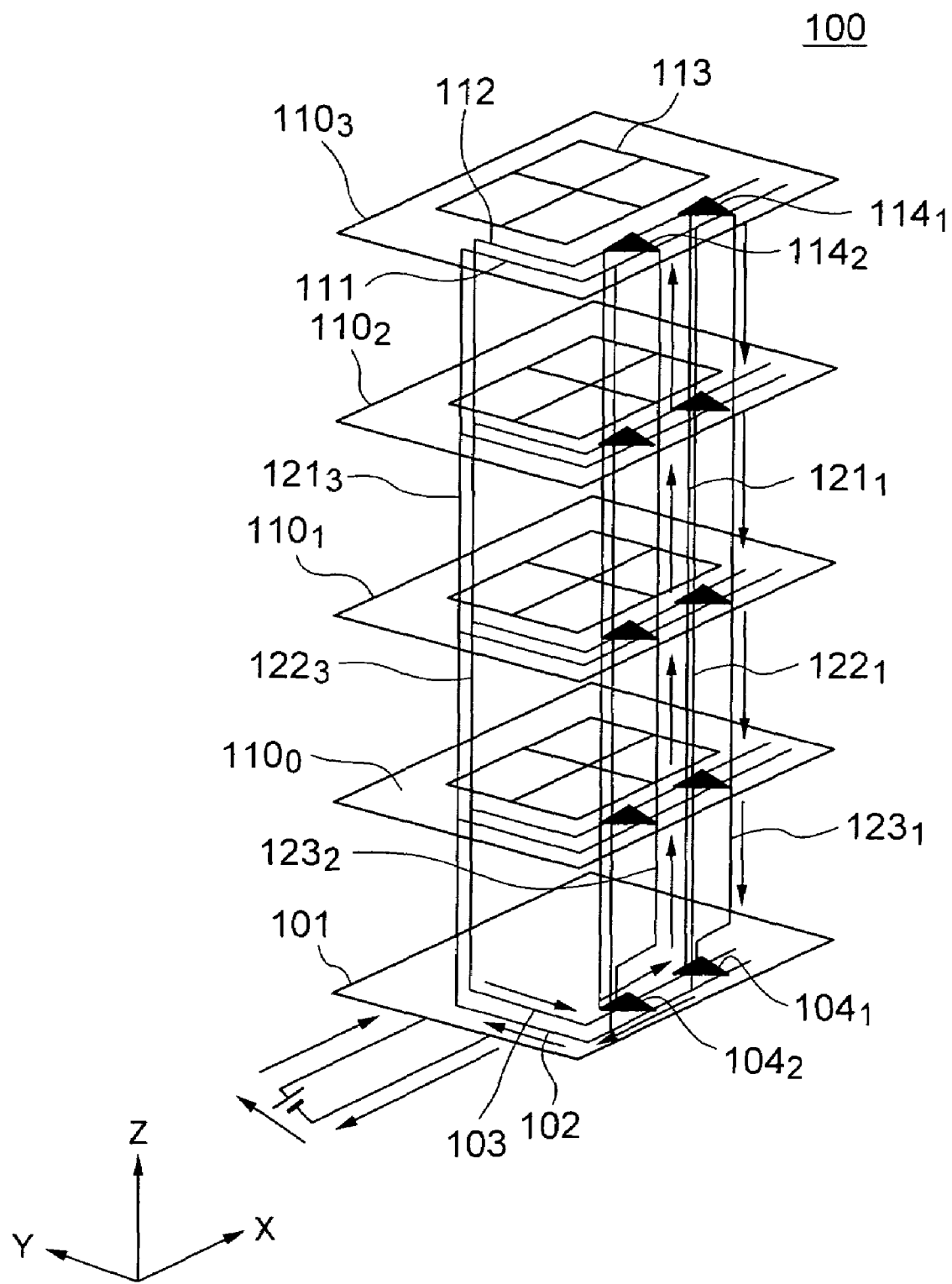
FIG. 1 is an exploded, perspective view of a semiconductor device according to a first embodiment of the present invention.

Now, the present invention is more specifically described with reference to accompanying drawings, wherein similar constituent elements are designated by similar reference numerals throughout the drawings.

Referring to FIG. 1, a semiconductor device, generally designated by numeral 100, according to a first embodiment of the present invention includes a plurality of semiconductor chips including a single IF chip 101 and a plurality of DRAM chips 110 ($110_0$ to $110_3$) consecutively layered on the IF chip 101. The plurality of DRAM chips 110 and the IF chips 101 are interconnected via a plurality of inter-chip electrodes. The inter-chip electrodes include a plurality of inter-chip source electrodes 121, a plurality of inter-chip ground electrodes 122, and a plurality of inter-chip signal electrodes 123, all of which penetrate the DRAM chips 110 at the peripheral areas thereof.

The IF chip 101 includes therein an intra-chip source line (high-potential source line) 102, an intra-chip ground line (low-potential source line) 103 and a plurality of receivers 104. Each DRAM chip 110 includes an intra-chip source line 111, an intra-chip ground line 112, a plurality of DRAM cells arranged in a memory cell area 113, and a plurality of drivers 114 arranged in the peripheral area of the each DRAM chip 110.

The electric power supplied from the external power source to the IF chip 101 is delivered through the intra-chip source line 102 and intra-chip ground line 103 in the IF chip 101, inter-chip source electrodes 121 and inter-chip ground electrodes 122 to the intra-chip source lines 111 and intra-chip ground line 112 provided in each of the DRAM chips 110.

Figure 2:
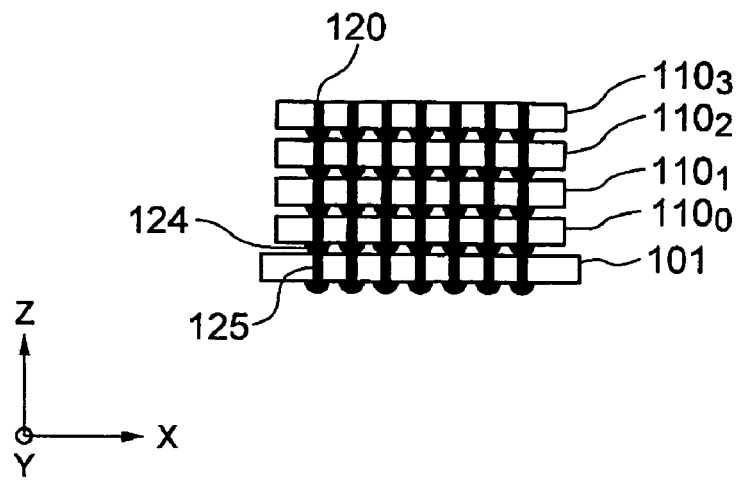
FIG. 2 is a sectional view of the semiconductor device of FIG. 1 taken in a peripheral area thereof.

FIG. 2 shows the semiconductor device 100 of FIG. 1 in a sectional view taken in a peripheral area thereof. Inter-chip electrodes 120 penetrate the semiconductor chips from the top DRAM chip $110_3$ to the bottom IF chip 101 in the Z-direction within the peripheral areas of the DRAM chips 110 and the IF chip 101. Each inter-chip electrode 120 is formed of a plurality of intra-chip plug electrodes 125 each formed in the DRAM chip 110 and IF chip 101, and a plurality of bumps 124 formed on the bottom surfaces of the DRAM chips 110 and IF chip 101 and electrically interconnected by the intra-chip plug electrodes 125.

The inter-chip electrodes 120 include inter-chip source electrodes 121, inter-chip ground electrodes 122, and inter-chip signal electrodes 123, as described before in connection with FIG. 1. The inter-chip source electrode 121 and the inter-chip ground electrode 122 may be provided for the purpose of reduction of the loop area of the current path during a signal transition of the inter-chip signal electrode 123 used for the interconnection between the chips, and/or for the purpose of reduction of cross-talk between. the inter-chip signal electrodes 123. The inter-chip electrodes 120 have a diameter of around 20 μm, for example, and are arranged at a pitch of around 50 μm, which is sufficient to prevent a short circuit failure between adjacent bumps 124. These diameter and pitch may be reduced, however, along with the possible developments of the technique for forming the inter-chip electrode.

Figure 3:
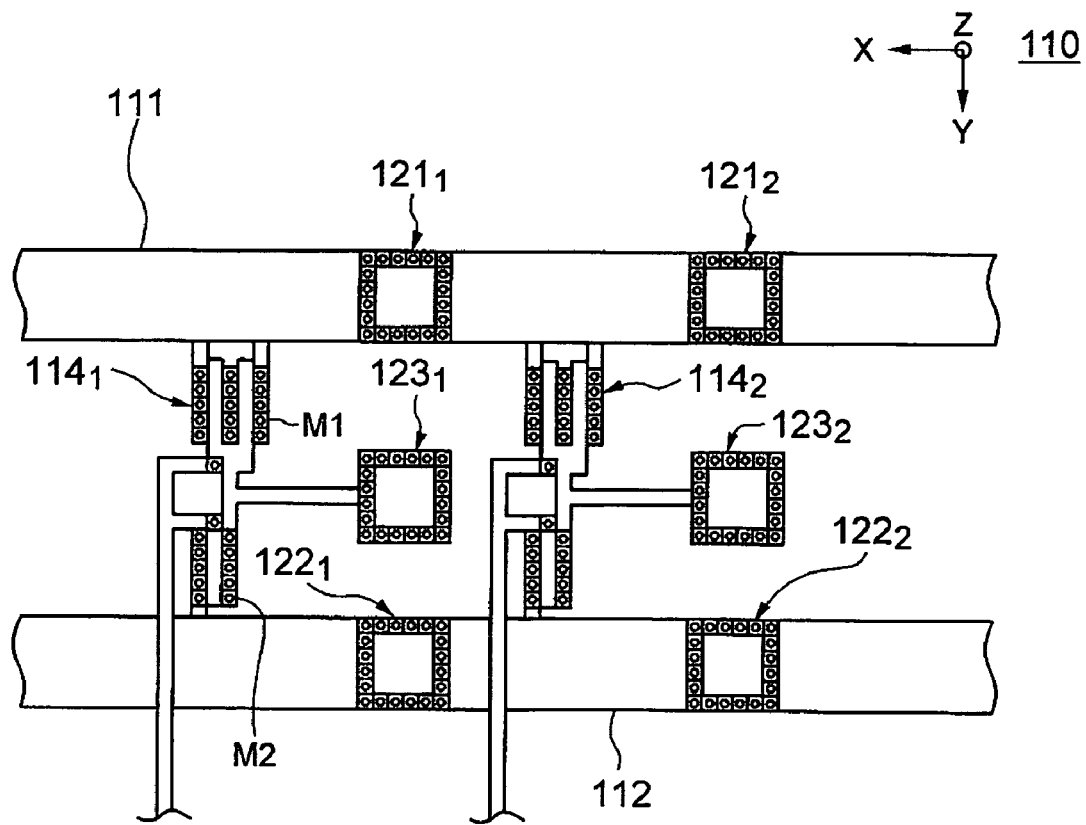
FIG. 3 is a top plan view of the vicinity of drivers in a semiconductor chip in the semiconductor device of FIG. 1.

FIG. 3 shows a peripheral area of one of the DRAM chips 110 in a top plan view thereof. An intra-chip source line 111 and an intra-chip ground line 112 extend parallel to one another in the X-direction, and are connected to the inter-chip source electrode 121 and the inter-chip ground electrode 122, respectively. Drivers 114 are arranged in a portion of the peripheral area sandwiched between the intra-chip source line 111 and the intra-chip ground line 112. Each driver 114 is arranged in the vicinity of one of the inter-chip source electrodes 121, a corresponding inter-chip signal electrode 123, and one of the inter-chip ground electrodes 122.

Each driver includes a pMOSFET M1 and an nMOSFET M2. The drivers 114 receive electric power from the inter-chip source electrodes 121 and the inter-chip ground electrodes 122 through the intra-chip source line 111 and the intra-chip ground line 112. The output signal from each driver 114 is delivered through the associated inter-chip signal electrode 123, which is sandwiched between one of the inter-chip source electrodes 121 and one of the inter-chip ground electrodes 122. In other words, an inter-chip source electrode 121, an inter-chip signal electrode 123 and an inter-chip ground electrode 122 are arranged in this order along a straight line in the Y-direction.

The ratio of the number of the inter-chip signal electrodes 123 to the number of the inter-chip source electrodes 121 or ground electrodes 122 may be changed depending on the length of the inter-chip electrodes. For example, if the number of layered chips is small, each inter-chip electrode has a small length, whereby the loop area of the current path is small and thus the cross-talk between the inter-chip signal electrodes is limited. In such a case, the ratio of the number of the inter-chip signal electrodes to the number of the inter-chip source electrodes or ground electrodes need not be 1:1, and may be N:1, where N is a natural number greater than one depending on the number of layered chips, for example.

Figure 4:
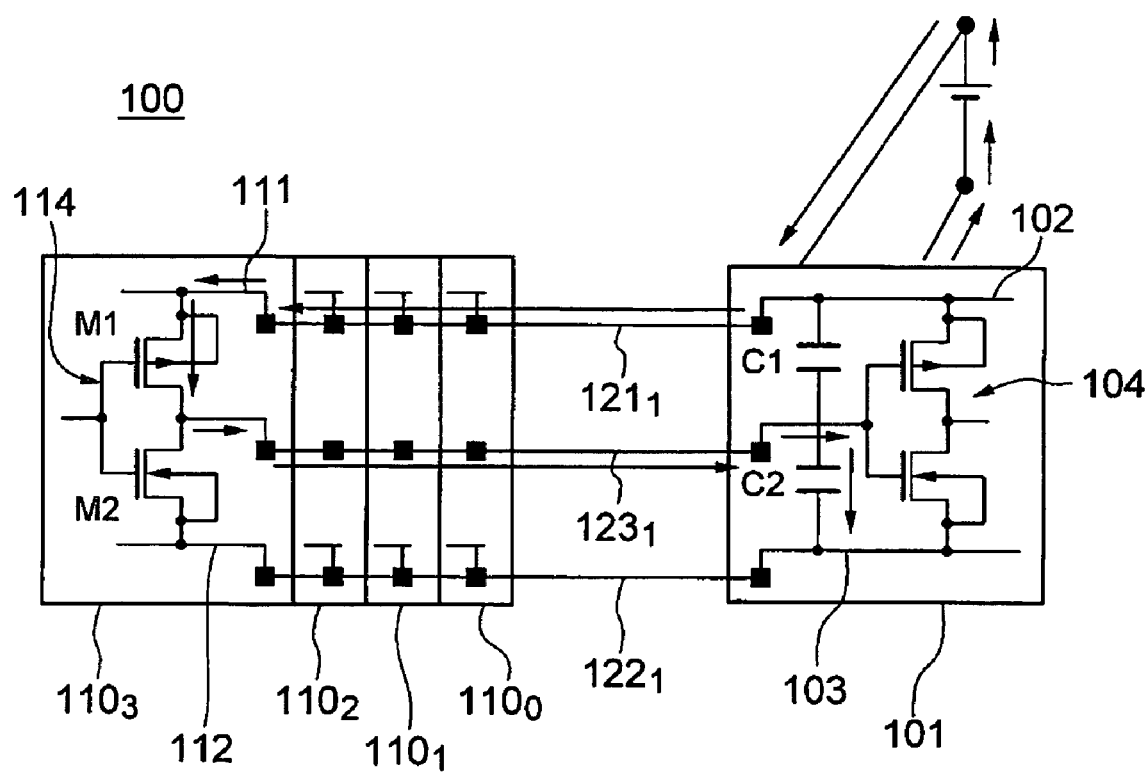
FIG. 4 is a schematic top plan view schematically showing the structure of the semiconductor device of FIG. 1 as well as the circuit diagram thereof.

FIG. 4 schematically shows the circuit configuration of the semiconductor device 100 of FIG. 1, wherein a receiver 104 in the IF chip 101 and a driver 114 in a DRAM chip 102 are schematically shown in association with the inter-chip electrodes 121 to 123. It is assumed here that the driver 114 in the top DRAM cell $110_3$ delivers an output signal, which rises from a low-level to a high level, and then falls from the high level to a low level.

When the output of the driver 114 assumes a low level, and a L-level signal is input to the gates of pMOSFET M1 and nMOSFET M2 of the driver 114, the pMOSFET M1 and nMOSFET M2 are turned ON and OFF, respectively, whereby the output of the driver 114 rises from the low level to a high level. During this rise of the output signal, the driver 114 receives a charge current from the external power source through the intra-chip source line 102, mainly the inter-chip source line $121_1$ nearest to the driver 114, and the intra-chip source line 111 in the DRAM chip $110_3$. The charge current returns to the external power source via the pMOSFET M1, inter-chip signal electrode $123_1$, a parasitic capacitance C2 between the input of the receiver 104 and the intra-chip ground line 103 in the IF chip 101, and the intra-chip ground line 103 in the IF chip 101.

If a H-level signal is then input to the gates of pMOSFET M1 and nMOSFET M2 after the rise of the output of the driver 114, the pMOSFET M1 and the nMOSFET M2 are turned OFF and ON, respectively, whereby the output of the driver 114 falls from the high level to a low level. During this fall of the output signal, the driver 114 receives a discharge current from the external power source through the intra-chip source line 102 in the IF chip 101, a parasitic capacitance C1 between the intra-chip source line 102 and the input of the receiver 104, and the inter-chip signal electrode $123_1$. The discharge current returns to the external power source via the nMOSFET M2, intra-chip ground line 112 in the DRAM chip $110_3$, mainly the inter-chip ground electrode $122_1$ nearest to the driver 114 and the intra-chip ground line 103 in the IF chip.

Figure 10:
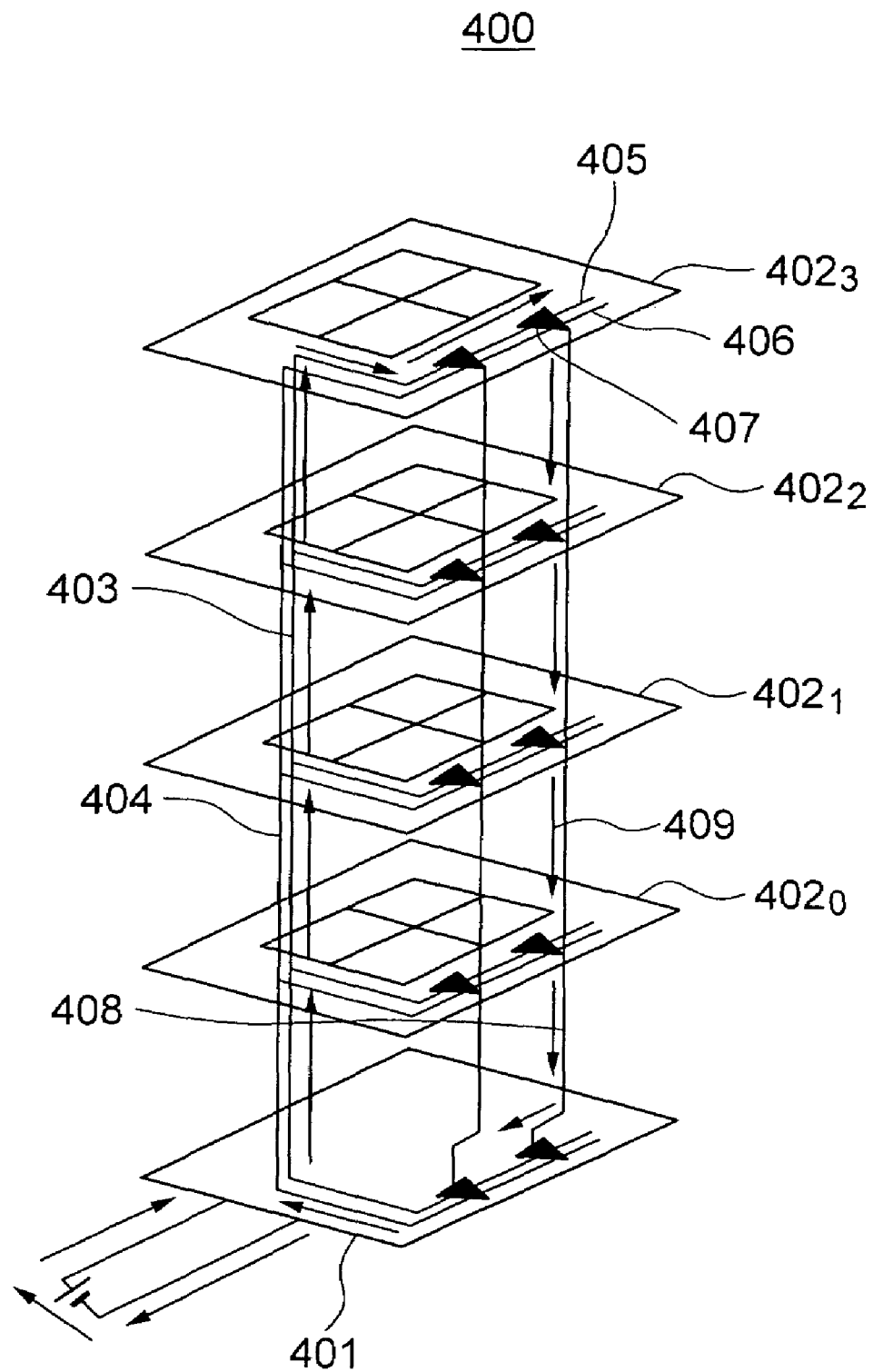
FIG. 10 is a perspective view of a conceivable structure for the conventional semiconductor device of FIG. 9, used for showing the analysis conducted by the inventor.

Here, the three-dimensional current path through which the driver 114 receives and returns the charge current or discharge current in the present embodiment is compared to the three-dimensional current path in the conventional semiconductor device shown in FIG. 10. In the conventional semiconductor device 400, since the inter-chip source electrode 403 and the inter-chip ground electrode 404 are located apart from the driver 407, the area defined by the loop current path of the charge current or discharge current is larger compared to the area defined by the loop current path of the charge current or discharge current in the semiconductor device 100 of the present embodiment. The smaller area of the loop current path as obtained in the present embodiment is due to the configuration wherein one of the inter-chip source electrodes 121 and one of the inter-chip ground electrodes 122 are located in the vicinity of the driver 114 and the inter-chip signal electrode 123 delivering the output signal of the driver 114.

In the present embodiment, the configuration wherein the inter-chip source electrodes 121 and the inter-chip ground electrodes 122 penetrate the DRAM chips 110 at the locations of the bumps 124 which are located adjacent to respective drivers 114 and inter-chip signal electrodes 123 allows a smaller area for the loop current path during each signal change of the drivers 114.

In general, the electric field "E" generated by the loop current path is expressed by the following formula:

$$E = 1.316 \times 10^{-14} \times (i \cdot f^2 \cdot S/r) \qquad (1),$$

where S, f, r and i are the area of the loop current path, frequency of the signal current, the distance between the location of the electric field and the loop current path and the magnitude of the loop current, respectively. The smaller area of the loop current path as obtained in the present embodiment reduces the electromagnetic noise during the signal change of the DRAM chips 110.

Figure 5:
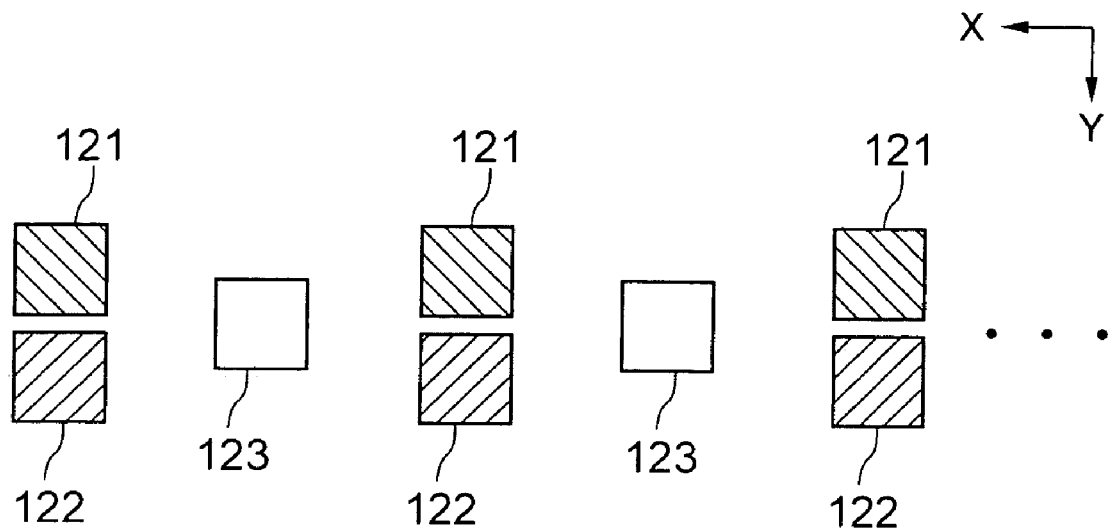
FIG. 5 is a partial top plan view of a semiconductor chip in a semiconductor device according to a second embodiment of the present invention.

FIG. 5 shows a partial top plan view of a semiconductor chip in a semiconductor device according to a second embodiment of the present invention. In the drawing, one of the inter-chip source electrodes 121 and one of the inter-chip ground electrodes 122 are arranged in pair. Two source electrode pairs each including the inter-chip source electrode 121 and the inter-chip ground electrode 122 sandwich therebetween a signal electrode 123. In other words, two inter-chip signal electrodes 123 sandwich therebetween a source electrode pair including the inter-chip source electrode 121 and the inter-chip ground electrode 122.

In the configuration of the present embodiment, since adjacent inter-chip signal electrodes 123 are separated by the source electrode pair, the cross-talk between the two inter-chip signal electrodes 123 is reduced as compared to the configuration shown in FIG. 3.

Figure 6:
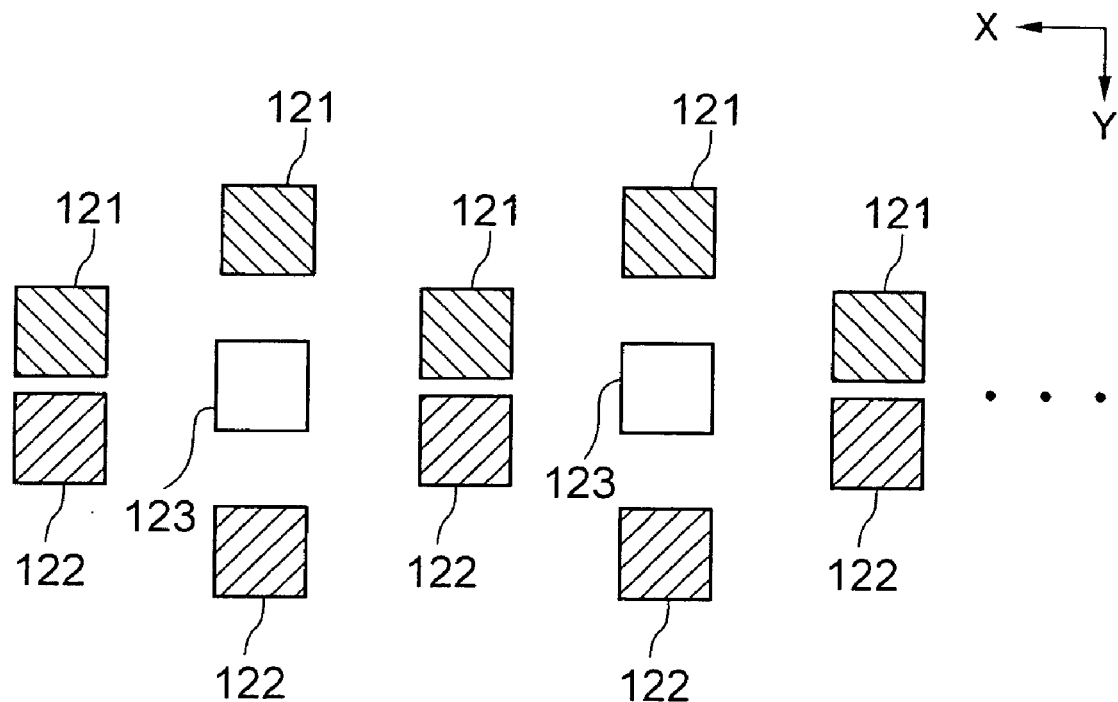
FIG. 6 is a partial top plan view of a semiconductor chip modified from the semiconductor chip of FIG. 5.

FIG. 6 shows a modification from the configuration shown in FIG. 5. In this modification, two adjacent inter-chip signal electrodes 123 are separated by the source electrode pair including an inter-chip source electrode 121 and an inter-chip ground electrode 122 in the X-direction similarly to FIG. 5, and in addition thereto, each signal electrode 123 is sandwiched between another source electrode pair similarly to FIG. 3 in the Y-direction. In this structure, each inter-chip signal electrode 123 is surrounded by the inter-chip source electrodes 121 and inter-chip ground electrodes 122 at the four sides thereof.

It should be noted that it is not necessary to sandwich all the inter-chip signal electrodes 123 between the inter-chip source electrode 121 and the inter-chip ground electrode 122. If all the inter-chip signal electrodes 123 cannot be sandwiched between the respective inter-chip source electrodes 121 and the respective inter-chip ground electrodes 122 due to the design of arrangement, it is preferable that a plurality of inter-chip signal electrodes 123 be arranged in the vicinity of an inter-chip source electrode 121 and an inter-chip ground electrode 122.

The inter-chip electrodes may be disposed in a matrix having N rows and M columns where N and M are natural numbers significantly greater than one. In such a case, each inter-chip signal electrode may be surrounded by a group of inter-chip source electrodes and inter-chip ground electrodes. This configuration allows the inter-chip signal electrode to be separated from another inter-chip signal electrode, whereby the loop area of the current path is reduced and cross-talk between the inter-chip signal electrodes can be reduced.

In addition, if a specific inter-chip signal electrode 123 generates only low electromagnetic noise due to, for example, a small signal current flowing therethrough, the specific inter-chip signal electrode 123 need not be associated with adjacent inter-chip source electrode 121 and inter-chip ground electrode 122, as will be understood from the formula (1) wherein the noise of the location at a distance "r" apart from the loop current depends on the frequency components of the loop current as well as the current value thereof.

Figure 7A:
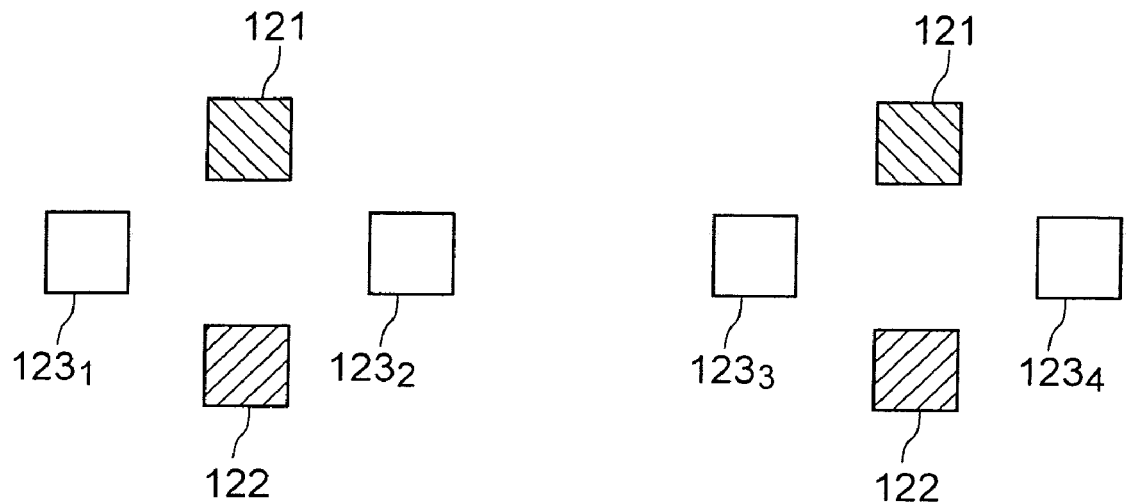
FIGS. 7A and 7B are partial top plan views of semiconductor chips modified from the semiconductor chip of FIG. 5.
Figure 7B:
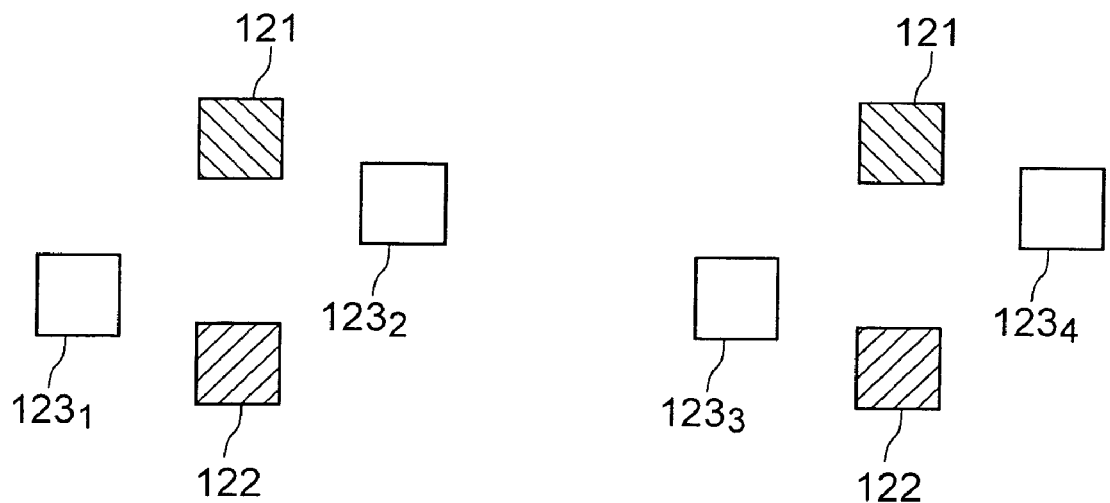
Figure 8A:
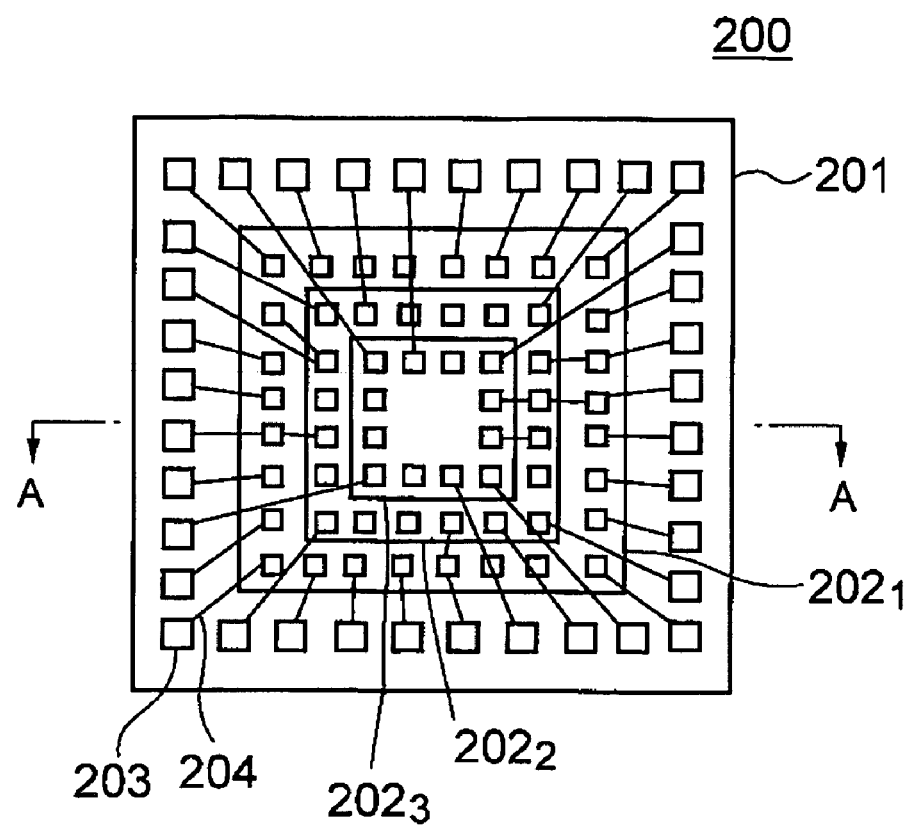
FIGS. 8A and 8B are a top plan view and a sectional view, respectively, of a conventional semiconductor device having multi-layered semiconductor chips.
Figure 8B:
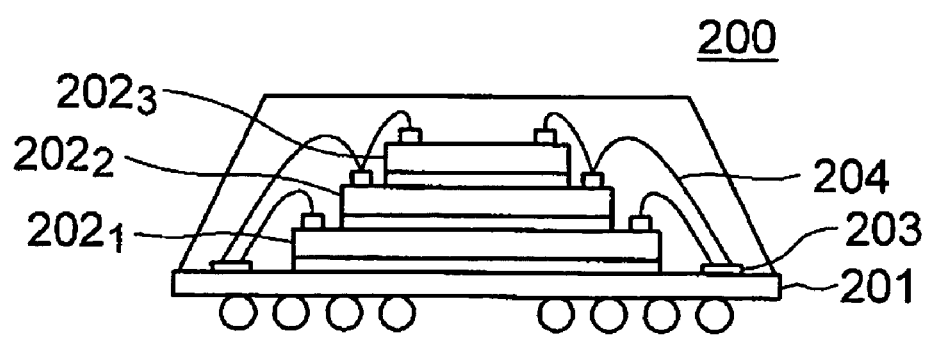
Figure 9:
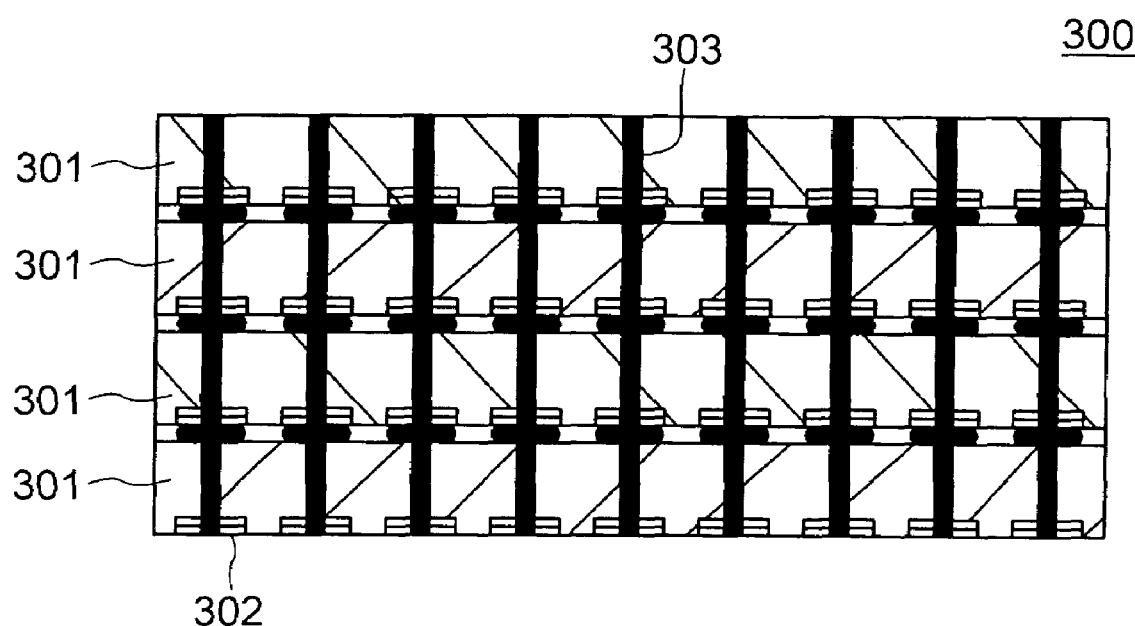
FIG. 9 is a sectional view of another conventional semiconductor device having multi-layered semiconductor chips and described in a publication.

FIGS. 7A and 7B exemplify different arrangements of the inter-chip electrodes, wherein two inter-chip signal electrodes 123 are associated with the source electrode pair including an inter-chip source electrode 121 and an inter-chip ground electrode 122. In FIG. 7A, four inter-chip signal electrodes 123 are arranged in the X-direction at a constant pitch, and each source electrode pair including the inter-chip source electrode 121 and the inter-chip ground electrode 122 is disposed between a corresponding pair of inter-chip signal electrodes 123.

FIG. 7B is modified from the arrangement of FIG. 7A such that each signal electrode pair is deviated from one another in the Y-direction for further achieving reduction of the cross-talk between the signal electrode pair 123 without changing the pitch of the inter-chip signal electrodes 123 in the X-direction.

In the embodiments and modifications as described above, the inter-chip signal electrode 123 is connected to the output of an inverter-type driver 114. However, the inter-chip signal electrode 123 may be connected to any driver such as an open-drain driver. Moreover, the semiconductor chip is not limited to DRAM chip or IF chip and may be any chip so long as the inter-chip electrodes are used for interconnecting layered chips. Some or one of the chips may be replaced by printed circuit boards or board etc.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising:
   plural semiconductor chips layered one on another; and
   plural inter-chip electrodes each penetrating at least one of said plural semiconductor chips and interconnecting at least two of said plural semiconductor chips,
   said plural inter-chip electrodes including plural inter-chip power source electrodes, plural inter-chip ground electrodes and plural inter-chip signal electrodes,
   wherein an electrode pair including one of said inter-chip power source electrodes and one of said inter-chip ground electrodes, which are immediately adjacent each other, is sandwiched between two of said inter-chip signal electrodes that are immediately adjacent said electrode pair,
   wherein current flowing through said inter-chip power source electrode is opposite in direction to current flowing through said inter-chip ground electrode.

2. A semiconductor device comprising:
   plural semiconductor chips layered one on another; and
   plural inter-chip electrodes each penetrating at least one of said plural semiconductor chips and interconnecting at least two of said plural semiconductor chips,
   said inter-chip electrodes including plural inter-chip power source electrodes, plural inter-chip ground electrodes and plural inter-chip signal electrodes,
   wherein one of said inter-chip signal electrodes is sandwiched between two immediately adjacent electrode pairs each including one of said inter-chip power source electrodes and one of said inter-chip ground electrodes,
   wherein current flowing through said inter-chip power source electrode is opposite in direction to current flowing through said inter-chip ground electrode.

3. A semiconductor device comprising:
   plural semiconductor chips layered one on another; and
   plural inter-chip electrodes each penetrating at least one of said plural semiconductor chips and interconnecting at least two of said plural semiconductor chips,
   said inter-chip electrodes including plural inter-chip power source electrodes, plural inter-chip ground electrodes and plural inter-chip signal electrodes,
   wherein an electrode pair including one of said inter-chip power source electrodes and one of said inter-chip ground electrodes is aligned in a first direction and is sandwiched between a pair of inter-chip signal electrodes, which are immediately adjacent each other and aligned in a second direction crossing said first direction,
   wherein current flowing through said inter-chip power source electrode is opposite in direction to current flowing through said inter-chip ground electrode.

4. The semiconductor device according to claim 1, wherein said semiconductor chips include an interface chip and a plurality of DRAM chips consecutively disposed on said interface chip, and said DRAM chips are connected to an external circuit via said interface chip.

5. The semiconductor device according to claim 2, wherein said two electrode pairs are aligned in a first direction and further comprising a third electrode pair including one of said inter-chip power source electrodes and one of said inter-chip ground electrodes, said third electrode pair being aligned in a second direction that is perpendicular to said first direction.

6. The semiconductor device according to claim 3, wherein said second direction is perpendicular to said first direction.

* * * * *